United States Patent
Stuber et al.

(10) Patent No.: US 8,859,347 B2
(45) Date of Patent: Oct. 14, 2014

(54) SEMICONDUCTOR-ON-INSULATOR WITH BACK SIDE BODY CONNECTION

(71) Applicant: Silanna Semiconductor U.S.A., Inc., San Diego, CA (US)

(72) Inventors: Michael A. Stuber, Carlsbad, CA (US); Stuart B. Molin, Carlsbad, CA (US); Paul A. Nygaard, Carlsbad, CA (US)

(73) Assignee: Silanna Semiconductor U.S.A., Inc., San Diego, CA (US)

( * ) Notice: Subject to any disclaimer, the term of this patent is extended or adjusted under 35 U.S.C. 154(b) by 0 days.

(21) Appl. No.: 13/746,288

(22) Filed: Jan. 21, 2013

(65) Prior Publication Data
US 2013/0130479 A1 May 23, 2013

Related U.S. Application Data

(63) Continuation of application No. 13/459,110, filed on Apr. 28, 2012, now Pat. No. 8,357,975, which is a continuation of application No. 12/836,506, filed on Jul. 14, 2010, now Pat. No. 8,232,597.

(60) Provisional application No. 61/225,914, filed on Jul. 15, 2009.

(51) Int. Cl.
| H01L 21/00 | (2006.01) |
| H01L 29/786 | (2006.01) |
| H01L 21/78 | (2006.01) |
| H01L 23/367 | (2006.01) |
| H01L 27/12 | (2006.01) |
| H01L 23/36 | (2006.01) |
| H01L 21/84 | (2006.01) |
| H01L 21/762 | (2006.01) |

(52) U.S. Cl.
CPC ...... *H01L 27/1207* (2013.01); *H01L 29/78606* (2013.01); *H01L 21/78* (2013.01); *H01L 23/3677* (2013.01); *H01L 27/1203* (2013.01); H01L 21/76256 (2013.01); *H01L 23/36* (2013.01); *H01L 21/84* (2013.01); *H01L 29/78603* (2013.01); H01L 2924/3011 (2013.01)

USPC .... 438/149; 257/347; 257/349; 257/E21.564; 257/E21.703; 257/E27.112

(58) Field of Classification Search
USPC ................. 438/149; 257/347, 349, E21.564, 257/E21.703, E27.112
See application file for complete search history.

(56) References Cited

U.S. PATENT DOCUMENTS

| 4,053,916 A | 10/1977 | Cricchi et al. |
| 5,376,579 A | 12/1994 | Annamalai |

(Continued)

FOREIGN PATENT DOCUMENTS

| EP | 0707388 A2 | 4/1996 |
| EP | 0986104 A1 | 3/2000 |

(Continued)

OTHER PUBLICATIONS

International Search Report and Written Opinion dated Oct. 14, 2010 for PCT/US2010/042026.

(Continued)

*Primary Examiner* — Andy Huynh
(74) *Attorney, Agent, or Firm* — The Mueller Law Office, P.C.

(57) ABSTRACT

Embodiments of the present invention provide for the removal of excess carriers from the body of active devices in semiconductor-on-insulator (SOI) structures. In one embodiment, a method of fabricating an integrated circuit is disclosed. In one step, an active device is formed in an active layer of a semiconductor-on-insulator wafer. In another step, substrate material is removed from a substrate layer disposed on a back side of the SOI wafer. In another step, an insulator material is removed from a back side of the SOI wafer to form an excavated insulator region. In another step, a conductive layer is deposited on the excavated insulator region. Depositing the conductive layer puts it in physical contact with a body of an active device in a first portion of the excavated insulator region. The conductive layer then couples the body to a contact in a second detached portion of the excavated insulator region.

20 Claims, 8 Drawing Sheets

(56) References Cited

U.S. PATENT DOCUMENTS

| | | |
|---|---|---|
| 5,489,792 A | 2/1996 | Hu et al. |
| 5,777,365 A | 7/1998 | Yamaguchi et al. |
| 5,793,107 A | 8/1998 | Nowak |
| 5,955,781 A | 9/1999 | Joshi et al. |
| 6,080,608 A | 6/2000 | Nowak |
| 6,110,769 A | 8/2000 | Son |
| 6,121,659 A | 9/2000 | Christensen et al. |
| 6,153,912 A | 11/2000 | Holst |
| 6,180,487 B1 | 1/2001 | Lin |
| 6,180,985 B1 | 1/2001 | Yeo |
| 6,190,985 B1 | 2/2001 | Buynoski |
| 6,191,476 B1 | 2/2001 | Takahashi et al. |
| 6,229,187 B1 | 5/2001 | Ju et al. |
| 6,352,882 B1 | 3/2002 | Assaderaghi et al. |
| 6,437,405 B2 | 8/2002 | Kim |
| 6,483,147 B1 | 11/2002 | Lin |
| 6,498,370 B1 | 12/2002 | Kim et al. |
| 6,531,753 B1 | 3/2003 | Lin |
| 6,566,240 B2 | 5/2003 | Udrea et al. |
| 6,573,565 B2 | 6/2003 | Clevenger et al. |
| 6,740,548 B2 | 5/2004 | Darmawan |
| 6,759,714 B2 | 7/2004 | Kim et al. |
| 6,833,587 B1 | 12/2004 | Lin |
| 6,847,098 B1 | 1/2005 | Tseng et al. |
| 6,889,429 B2 | 5/2005 | Celaya et al. |
| 6,900,501 B2 | 5/2005 | Darmawan |
| 7,052,937 B2 | 5/2006 | Clevenger et al. |
| 7,109,532 B1 | 9/2006 | Lee et al. |
| 7,135,766 B1 | 11/2006 | Costa et al. |
| 7,227,205 B2 | 6/2007 | Bryant et al. |
| 7,238,591 B1 | 7/2007 | Lin |
| 7,541,644 B2 | 6/2009 | Hirano et al. |
| 7,713,842 B2 | 5/2010 | Nishihata et al. |
| 7,759,220 B2 | 7/2010 | Henley |
| 7,906,817 B1 | 3/2011 | Wu et al. |
| 2002/0027271 A1 | 3/2002 | Vaiyapuri |
| 2002/0041003 A1 | 4/2002 | Udrea et al. |
| 2002/0079507 A1 | 6/2002 | Shim et al. |
| 2002/0086465 A1 | 7/2002 | Houston |
| 2002/0089016 A1 | 7/2002 | Joly et al. |
| 2002/0163041 A1 | 11/2002 | Kim |
| 2002/0175406 A1 | 11/2002 | Callahan |
| 2004/0051120 A1 | 3/2004 | Kato |
| 2004/0150013 A1 | 8/2004 | Ipposhi |
| 2004/0232554 A1 | 11/2004 | Hirano et al. |
| 2004/0245627 A1 | 12/2004 | Akram |
| 2004/0251557 A1 | 12/2004 | Kee |
| 2005/0230682 A1 | 10/2005 | Hara |
| 2005/0236670 A1 | 10/2005 | Chien et al. |
| 2006/0189053 A1 | 8/2006 | Wang et al. |
| 2007/0018247 A1 | 1/2007 | Brindle et al. |
| 2007/0254457 A1 | 11/2007 | Wilson et al. |
| 2008/0081481 A1 | 4/2008 | Frohberg et al. |
| 2008/0128900 A1 | 6/2008 | Leow et al. |
| 2008/0150100 A1 | 6/2008 | Hung et al. |
| 2008/0165521 A1* | 7/2008 | Bernstein et al. ............. 361/820 |
| 2008/0283995 A1 | 11/2008 | Bucki et al. |
| 2009/0011541 A1 | 1/2009 | Corisis et al. |
| 2009/0026454 A1 | 1/2009 | Kurokawa et al. |
| 2009/0160013 A1 | 6/2009 | Abou-Khalil et al. |
| 2011/0266659 A1 | 11/2011 | Wilson et al. |
| 2013/0043595 A1 | 2/2013 | Williams |

FOREIGN PATENT DOCUMENTS

| | | |
|---|---|---|
| GB | 2309825 | 8/1997 |
| GB | 2418063 A | 3/2006 |
| JP | 2110974 | 4/1990 |
| JP | 03011666 | 1/1991 |
| JP | 04356967 | 12/1992 |
| JP | 07098460 | 4/1995 |
| JP | 9283766 | 10/1997 |
| JP | 2001230423 | 8/2001 |
| JP | 2005175306 | 6/2005 |
| WO | 0225700 A | 3/2002 |
| WO | 2008011210 A1 | 1/2008 |
| WO | 2009045859 A1 | 4/2009 |

OTHER PUBLICATIONS

International Search Report and Written Opinion dated Oct. 14, 2010 for PCT/US2010/042028.
International Search Report and Written Opinion dated Mar. 22, 2011 for International Application No. PCT/US2010/042027.
Matloubian, M. "Smart Body Contact for SOI MOSFETs", SOS/SOI Technology Conference, Oct. 3-5, 1989.
Office Action dated Aug. 31, 2012 for U.S. Appl. No. 12/836,559.
Office Action Dated Dec. 12, 2012 for U.S. Appl. No. 13/452,836.
Office Action dated Jul. 13, 2012 for U.S. Appl. No. 12/836,510.
Office Action dated Nov. 9, 2012 for U.S. Appl. No. 12/836,510.
Sematech Manufacturing and Reliability Challenges for 3D ICs using TSVs, Sep. 25-26, 2008, San Diego, California "Thermal and Strees Analysis Modeling for 3D Memory over Processor Stacks", John McDonald, Rochester Polytechnic Institute.
Sleight, Jeffry W. et al., "DC and Transient Characterization of a Compact Schottky Body Contact Technology for SOI Transistors", IEEE Transactions on Electronic Devices, IEEE Service Center, Pisacataway, NJ, US, vol. 46, No. 7, Jul. 1, 1999.
European Examination Report dated Mar. 19, 2013 for European Application No. 10 734 619.9.
Office Action dated Feb. 28, 2013 for U.S. Appl. No. 12/836,559.
Examination report dated Nov. 29, 2013 for European Application No. 10734619.9.
Office Action dated Oct. 9, 2013 for Chinese Application No. 201080031814.1.
Office action dated Dec. 2, 2013 for Chinese Patent Application No. 201080031818.X.
Office Action Dated Feb. 10, 2014 for U.S. Appl. No. 13/725,403.
International Search Report and Written Opinion dated Mar. 31, 2014 for PCT Application No. PCT/US2013/073466.
Office Action dated Apr. 23, 2014 for Chinese Patent Application No. 201080031814.1.
Office Action dated Apr. 8, 2014 for Japanese Patent Application No. 2012-520758.
Office Action dated Mar. 20, 2014 for U.S. Appl. No. 13/725,245.
Office action dated Mar. 28, 2014 for U.S. Appl. No. 13/725,306.

* cited by examiner

SEMICONDUCTOR-ON-INSULATOR WITH BACK SIDE BODY CONNECTION

CROSS-REFERENCE TO RELATED APPLICATIONS

This patent application is a continuation of U.S. patent application Ser. No. 13/459,110 filed on Apr. 28, 2012, which is a continuation of U.S. patent application Ser. No. 12/836,506 filed Jul. 14, 2010, which claims the benefit of U.S. Provisional Patent No. 61/225,914 filed Jul. 15, 2009. The content of U.S. Provisional Patent No. 61/225,914 is incorporated herein by reference.

FIELD OF THE INVENTION

The invention described relates to semiconductor-on-insulator devices and processing generally, and more specifically to floating-body effects in semiconductor-on-insulator devices.

BACKGROUND OF THE INVENTION

Semiconductor-on-insulator (SOI) technology was first commercialized in the late 1990s. The defining characteristic of SOI technology is that the semiconductor region in which circuitry is formed is isolated from bulk substrate by an electrically insulating layer. This insulating layer is typically silicon-dioxide. The reason silicon-dioxide is chosen is that it can be formed on a wafer of silicon by oxidizing the wafer and is therefore amenable to efficient manufacturing. The advantageous aspects of SOI technology stem directly from the ability of the insulator layer to electronically isolate the active layer from bulk substrate. As used herein and in the appended claims, the region in which signal-processing circuitry is formed on an SOI structure is referred to as the active layer of the SOI structure.

SOI technology represents an improvement over traditional bulk substrate technology because the introduction of the insulating layer isolates the active devices in an SOI structure which improves their electrical characteristics. For example, the threshold voltage of a transistor is desirously uniform, and is set in large part by the characteristics of the semiconductor material underneath the transistor's gate. If this region of material is isolated, there is less of a chance that further processing will affect this region and alter the threshold voltage of the device. Additional electrical characteristic improvements stemming from the use of the SOI structure include fewer short channel effects, decreased capacitance for higher speed, and lower insertion loss if the device is acting as a switch. In addition, the insulating layer can act to shield the active devices from harmful radiation. This is particularly important for integrated circuits that are used in space given the prevalence of harmful ionizing radiation outside the earth's atmosphere.

SOI wafer 100 is shown in FIG. 1. The wafer includes substrate layer 101, insulator layer 102, and active layer 103. The substrate is typically a semiconductor material such as silicon. Insulator layer 102 is a dielectric which is often silicon-dioxide formed through the oxidation of substrate layer 101. Active layer 103 includes a combination of dopants, dielectrics, polysilicon, metal layers, passivation, and other layers that are present after circuitry 104 has been formed therein. Circuitry 104 may include metal wiring; passive devices such as resistors, capacitors, and inductors; and active devices such as transistors. As used herein and in the appended claims, the "top" of SOI wafer 100 references top surface 105 while the "bottom" of SOI wafer 100 references bottom surface 106. This orientation scheme persists regardless of the relative orientation of SOI wafer 100 to other frames of reference, and the removal of layers from, or the addition of layers to SOI wafer 100. Therefore, active layer 103 is always "above" insulator layer 102. In addition, a vector originating in the center of active layer 103 and extending towards bottom surface 106 will always point in the direction of the "back side" of the SOI structure regardless of the relative orientation of SOI wafer 100 to other frames of references, and the removal of layers from, or the addition of layers to SOI wafer 100.

Semiconductor devices can be subject to a phenomenon known as the floating-body effect. Semiconductor-on-insulator devices are particularly susceptible to this effect. The manner in which the floating-body effect is exhibited by an n-type field effect transistor (NFET) will be described for illustrative purposes, but the floating-body effect is exhibited by many other active devices. FIG. 1B displays a side-view of NFET 108. NFET 108 is an SOI device, and is therefore disposed above insulator layer 102. The floating-body effect is caused by the presence of excess carriers in body 109. Carriers can build up in body 109 through random generation of electron and hole pairs by thermal or optical means, through scattering of high speed electrons in channel 110, through leakage from source 111 or drain 112, through band-to-band tunneling, or through avalanche breakdown in channel 110. The presence of excess carriers is therefore inevitable in any semiconductor device. However, in an SOI device, body 109 is isolated and limited as compared to a device whose body is part of bulk substrate. Therefore, far fewer excess carriers are needed to alter the characteristics of the active device.

Two alterations to the characteristics of an active device caused by the floating-body effect that are exacerbated by an SOI structure are the kink effect, and the non-linear capacitance exhibited by an active device that is in an off state. The introduction of excess carriers to body 109 due to avalanche breakdown caused by a high potential applied across source 111 and drain 112 will have the effect of greatly increasing the current through channel 110. The effect is called the kink effect because the relatively flat portion on a curve of the channel current against the drain-source potential will have a kink upwards at the point where this effect takes hold. The relatively flat portion of the curve is located in a region where the current is—for some applications—desirously set predominately by the voltage at gate 113. This effect can therefore be problematic because certain analog circuit applications are dependent upon the current of an active device being independent of the drain-source potential when operating in this region.

In contrast to the kink effect, the non-linearity of a device's off-state capacitances is not caused by avalanche breakdown. Instead, carriers build up through other less aggressive means as described above. If the potential of body 109 shifts to a significant enough degree, the capacitance seen by a signal at drain 112 will change in a non-linear fashion. The change will be non-linear because the excess carriers will build up in body 109 over time making the capacitance time-variant. Also, the charge build up will make the capacitance of the junction between body 109 and drain 112 dependent upon the signal at drain 112 which is also a characteristic of a non-linear system. This effect can be problematic because certain circuit designs are dependent upon the retention of a highly linear characteristic for their processed signals. For example, if NFET 108 was being used as a switch in a radio-frequency (RF) application wherein it had to be in an off state while a signal was transmitted on a line connected to drain 112, the capacitance from drain 112 to body 109 would have to be linear in order to prevent the production of unwanted harmonic distortion and inter-modulation distortion in the signal.

A common solution to the floating-body effect in SOI devices includes the introduction of a connection from body 109 to source 111. This solution is a subset of the more general family of solutions involving the use of what is called a "body tie", or "body contact". A body contact provides a connection to body 109 which serves to remove excess carriers. The particular solution of connecting body 109 to source 111 is employed most commonly because it is so simple. Unwanted charge that builds up in body 109 will be able to escape from body 109 to source 111, and will therefore not cause the kink effect or lead to the production of a non-linear capacitance.

Another solution to the floating-body effect in SOI devices involves the use of a smart body tie. A smart body tie is a body tie that changes its state based on the state of the device for which it is providing a tie. An example of a smart body tie can be described with reference to FIG. 1C. FIG. 1C comprises an NFET 114. The source of NFET 114 is connected to ground 115. The drain of NFET 114 is connected to drain contact 116. The gate of NFET 114 is connected to gate contact 117, and the cathode of diode 118. The body of NFET 114 is connected to the anode of diode 118. A similar configuration could function by replacing NFET 114 with a PFET and reversing the polarity of diode 118. This structure is advantageous in certain situations because the body tie formed by diode 118 will conduct much more when the device is off as compared to when the device is on. This can be very helpful for the situation described above wherein a non-linear off-state capacitance of the FET would imbue a processed signal on drain contact 116 with distortion. When gate contact 117 is low and the device is off, current will flow from the body of NFET 114 to gate contact 117 through diode 118. However, when gate contact 117 is high, the path from the body to gate will effectively be cut off. This can be highly advantageous given that the kink effect provides a benefit from the perspective of providing higher current during the device's on-state current. Therefore, this structure allows for the drawbacks of the floating body effect in one application to be eliminated while preserving the advantages of the floating body effect.

Although these approaches have advantageous aspects in that they are able to remove excess charge from the body of an active device, they are at the same time slightly problematic because they generally require another layer of processing in close contact to the active devices. This additional processing can complicate the fabrication process and can generally lead to non-idealities in the fabricated active devices through manufacturing errors. In addition, these approaches require additional area on the active wafer which increases the cost of the overall design. These approaches also suffer from the disadvantage of high resistance along the width of the transistor from the body tie to the most remote portion of the channel. High resistance can reduce the efficacy of the body tie in reducing floating body effects. Finally, these approaches may introduce parasitic capacitance to nodes of the device that will limit the speed of any circuit utilizing such a device.

SUMMARY OF THE INVENTION

In one embodiment of the invention, a semiconductor-on-insulator structure is disclosed. The SOI structure comprises an electrically conductive layer. The SOI structure additionally comprises an insulator layer located above the electrically conductive layer, and partially vertically coextensive with the electrically conductive layer in an excavated insulator region. The SOI structure additionally comprises an active layer located above the insulator layer, and comprising an active device with a body. The SOI structure additionally comprises a body contact physically connecting the electrically conductive layer and the body, and is located in a first portion of the excavated insulator region. The electrically conductive layer couples the body contact to a contact in the active layer. In addition, the contact in the active layer is located in a second portion of the excavated insulator region. In addition, the second portion is detached from the first portion.

In another embodiment of the invention, a method of fabricating an integrated circuit is disclosed. In one step, an active device is formed in an active layer of a semiconductor-on-insulator wafer. In another step, substrate material is removed from a substrate layer disposed on a back side of the SOI wafer. In another step, an insulator material is removed from a back side of the SOI wafer to form an excavated insulator region. In another step, a conductive layer is deposited on the excavated insulator region. Depositing the conductive layer puts it in physical contact with a body of an active device in a first portion of the excavated insulator region. The conductive layer then couples the body to a contact in a second detached portion of the excavated insulator region.

In another embodiment of the invention a method of removing unwanted accumulated majority-type carriers from the channel of a semiconductor-on-insulator active device is disclosed. In a first step, unwanted accumulated majority-type carriers are conducted from said channel to a body contact of the active device. The body contact physically connects an electrically conductive layer and a body of the active device. In a second step, unwanted accumulated majority-type carriers are conducted through a circuit branch in the electrically conductive layer. The electrically conductive layer is located below an insulator layer, and is partially vertically coextensive with the insulator layer in an excavated insulator region. The circuit branch couples the body contact to a contact. The body contact is located in a first portion of the excavated insulator region, and the contact is located in a second detached portion of the excavated insulator region.

DETAILED DESCRIPTION OF THE EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers such modifications and variations as are within the scope of the appended claims and their equivalents.

Embodiments of the present invention provide for the production of SOI devices that have space-saving efficient back side body contacts. Embodiments of the invention achieve this result through the utilization of back side processing, the removal of portions of the SOI buried insulator layer, and the deposition of an electrically conductive material which connects a body contact of an active device to a second contact located in the same active layer as the active device itself.

Figure 1A:
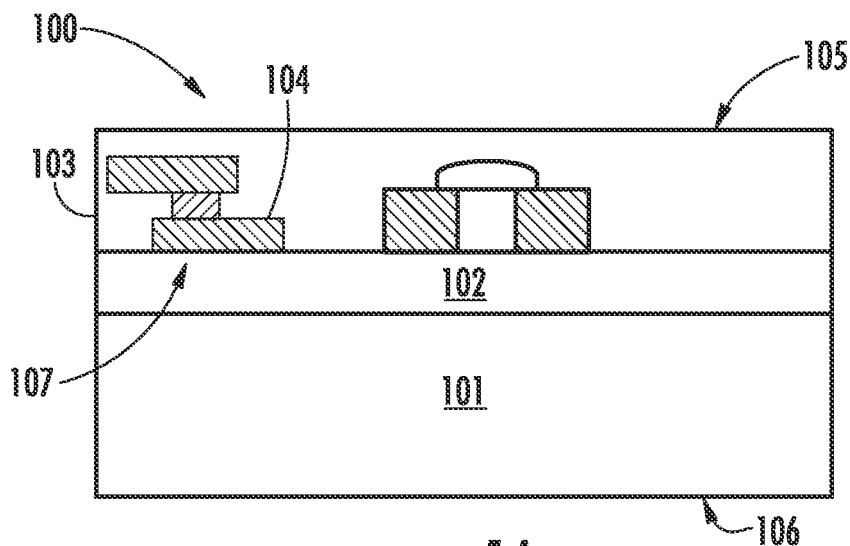
FIGS. 1A and 1B illustrate a block diagram of an SOI device that is susceptible to the floating-body effect that is in accordance with the prior art.
Figure 1B:
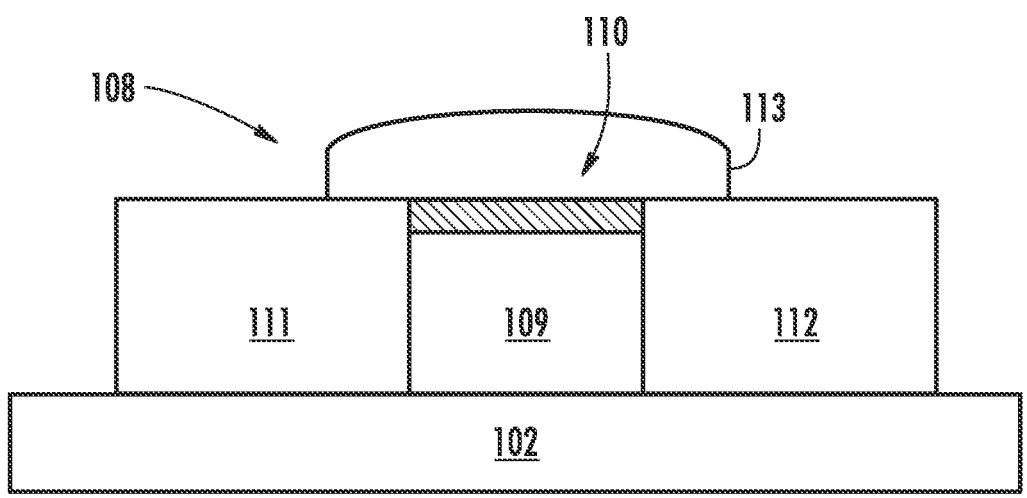
Figure 1C:
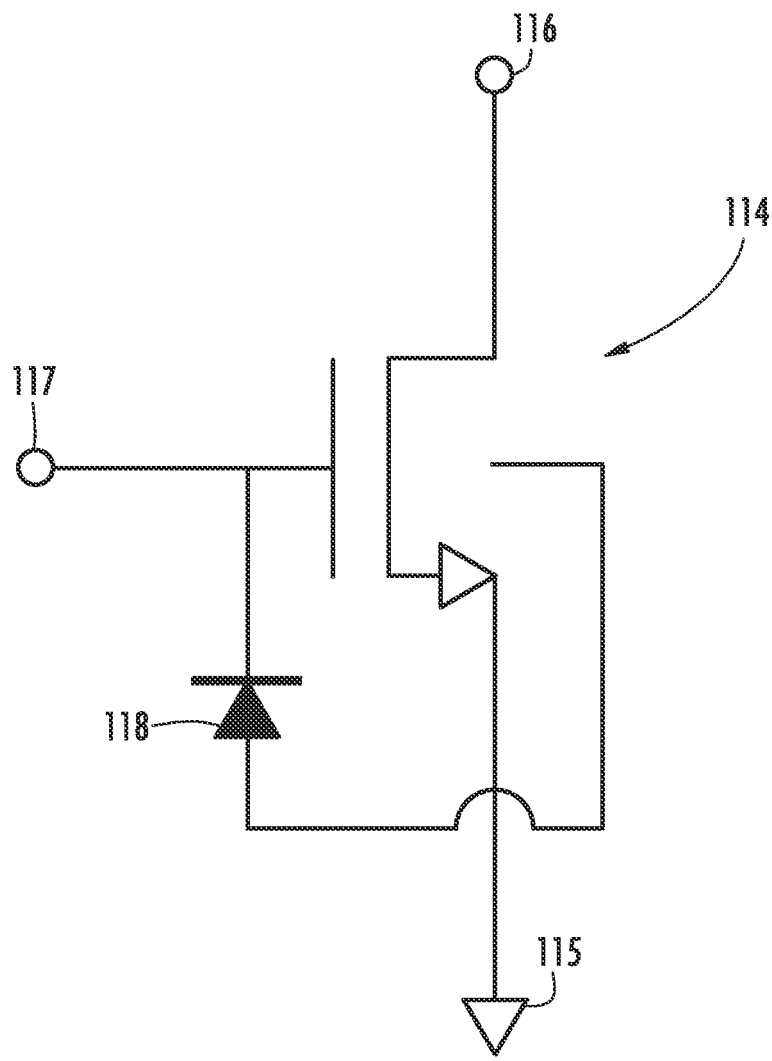
FIG. 1C illustrates a block diagram of an NFET with a smart body contact that is in accordance with the prior art.
Figure 2:
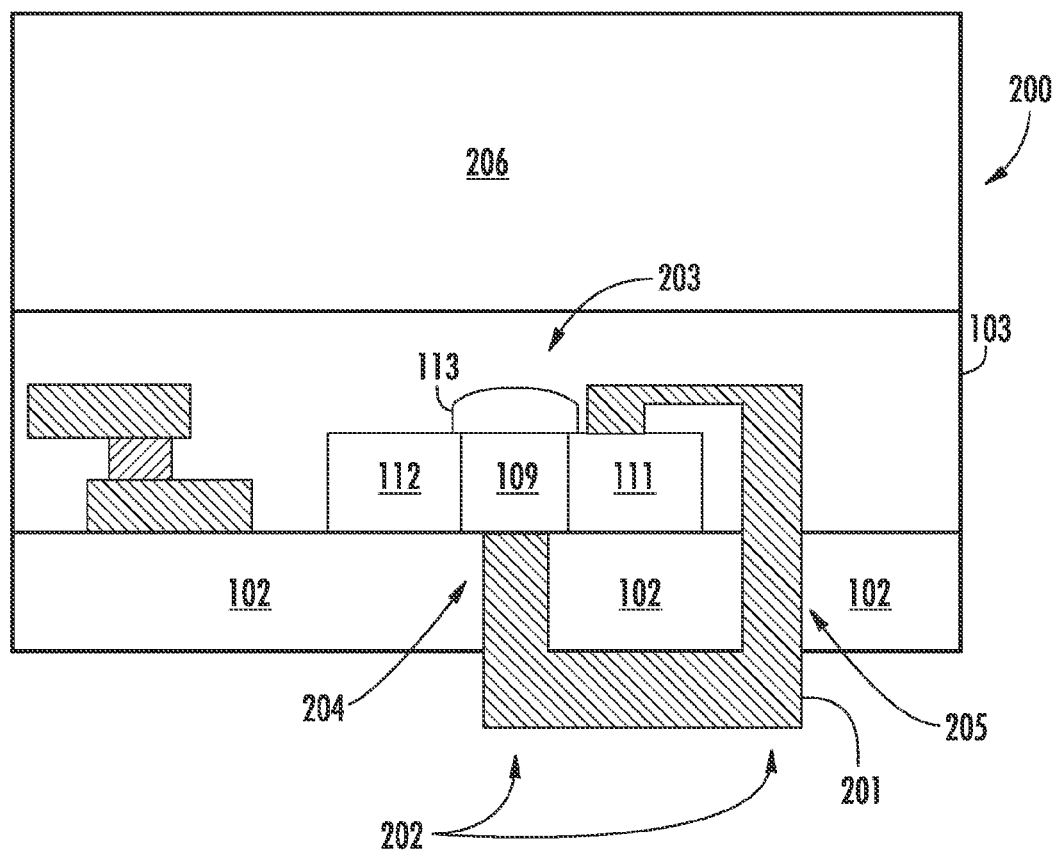
FIG. 2 illustrates a block diagram of an SOI structure with a back side body contact that is in accordance with the present invention.

FIG. 2 displays SOI structure 200 which is in accordance with the present invention. As with prior art SOI devices, active layer 103 is above insulator layer 102. Electrically conductive layer 201 is below insulator layer 102, and is disposed on the back side of insulator layer 102 such that it fills excavated insulator region 202. As seen in the figure, insulator layer 102 is at least partially vertically coextensive with electrically conductive layer 201 in excavated insulator region 202. As used herein and in the appended claims, the term "region" is not meant to be limited to the description of a single contiguous region. Excavated insulator region 202 therefore allows for separate physical contacts between the body 109 of active device 203 and electrically conductive layer 201 at body contact 204, and between said electrically conductive layer 201 and said active layer 103 at second contact 205. Active layer 103 is bonded to handle wafer 206 to provide support to active layer 103 while it is being processed. However, handle wafer 206 can be removed at a later time during processing. In addition, stability during processing may be provided by other means such that handle wafer 206 does not need to be attached at all.

Embodiments of the present invention which are described with reference to FIG. 2 in the previous paragraph function to remove excess carriers from body 109 to alleviate the floating body effect for active device 203. Excess carriers that build up in body 109 are able to flow out through electrically conductive layer 201 and back into active layer 103. Handle wafer 206 allows for the processing of the SOI structure from the back side which enables easy access to the body of active device 203. Advantageously, active device 203 can be formed in active layer 103 unimpeded by the need for body tie circuitry. As such, the body tie circuitry is much less likely to adversely affect the finished active devices or hinder the flexibility of a designer that develops the layout for the active devices. In addition, any parasitic capacitance that results from having body tie circuitry close by can be greatly alleviated because only a small contact is needed near the body of the device.

A specific embodiment of the present invention can be described with reference again to FIG. 2. In FIG. 2, a circuit branch comprising both body contact 204 and second contact 205 connects to both source 111 of active device 203, and body 109 of active device 203. In specific embodiments of the invention, the configuration shown in FIG. 2 allows excess carriers to flow to source 111 and then away from active device 203 along the source electrode. This is a convenient configuration given that the source of NFETs will generally be at a lower potential than body 109 so p-type carriers will flow out through this circuit branch. In addition, the source of a p-type field effect transistor (PFET) will generally be at a higher potential than body 109 so n-type carriers will flow out through this circuit branch. Another specific embodiment of the present invention comprises a circuit branch comprising both body contact 204 and second contact 205. However, in contrast to the configuration shown in FIG. 2, the circuit branch that includes body contact 204 and second contact 205 connects gate 113 to body 109. The resultant device is commonly referred to as a dynamic-threshold FET (DTFET or DTMOS). This configuration will function by providing a path for carriers to leave body 205 as they will be attracted to the signal source for gate 210. The DTMOS device provides higher threshold voltage when the transistor is biased in the OFF condition and lower threshold voltage when the device is in the ON condition. This advantageously provides low leakage when OFF and high drive strength when it is turned ON.

The back side processing concepts discussed above with reference to FIG. 2 can be applied to the formation of smart body contacts to form structures that are in accordance with the present invention. In specific embodiments of the present invention, a variable impedance circuit branch comprising body contact 204 and second contact 205 is configured to have a high impedance when active device 203 is in an on state, and a low impedance when active device 203 is not in an on state. Although these embodiments are described below with reference to NFET devices the same result can be achieved by using a PFET device in place of the described NFET device while also configuring any attached diodes to have opposite polarity.

Figure 3:
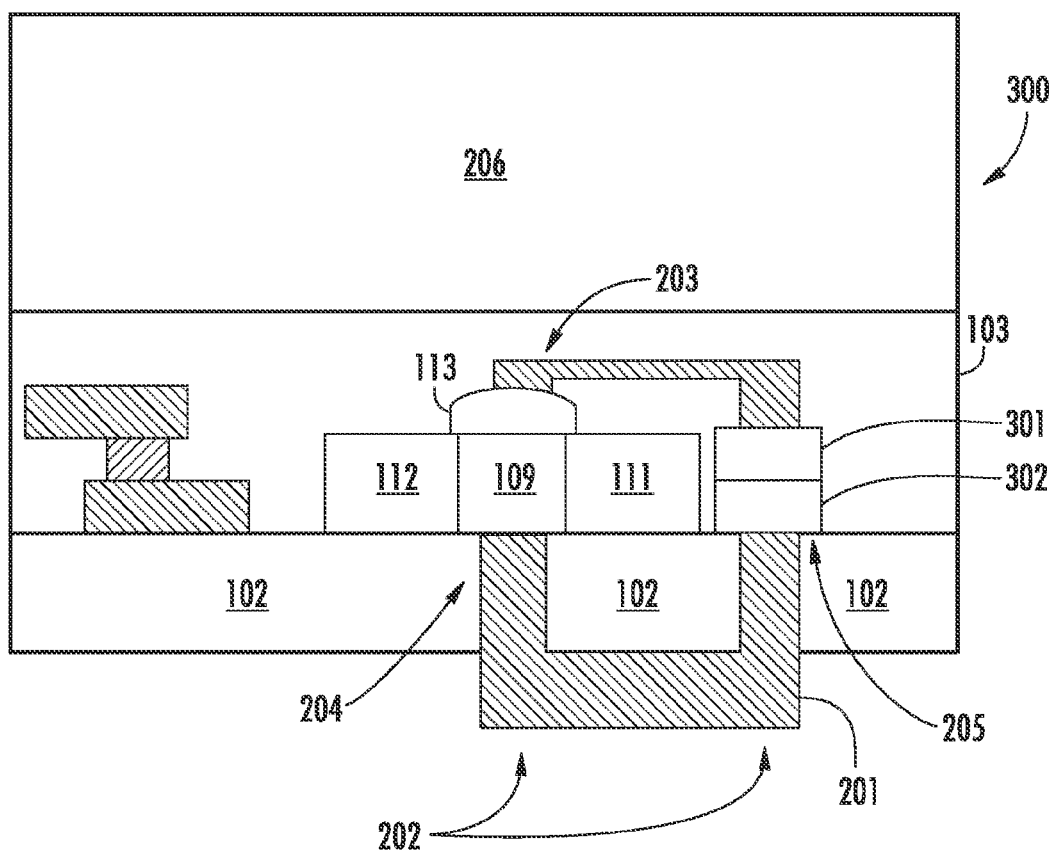
FIG. 3 illustrates a block diagram of an SOI structure with a back side body contact coupled to a gate through a pn-junction diode that is in accordance with the present invention.

An SOI structure 300 that is in accordance with the present invention can be described with reference to FIG. 3. In FIG. 3, gate 113 is coupled to electrically conductive layer 201 through a diode comprising anode 302 and cathode 301. In specific embodiments of the invention, anode 302 will comprise a region of active layer 103 that has been doped more using the same doping profile as body 109. In specific embodiments of the invention, such as embodiments employing thin-film silicon processes, anode 302 and cathode 301 will be side-by-side in active layer 103 rather than stacked vertically. The circuit branch comprising this diode has variable impedance based on the relative voltages of gate 113 and body 109. In the situation where the potential of gate 113 drops, the impedance of this variable impedance circuit branch will drop nearly to zero thereby latching body 109 to gate 113 when the gate is low.

Embodiments of the present invention which are described with reference to FIG. 3 in the previous paragraph function to filter the benefits of the floating-body effect from the effect's drawbacks when active device 203 is used in certain applications. These advantages are discussed above with reference to prior art smart body contacts. As before with reference to FIG. 2, these benefits are achieved without having to disturb or alter the layout of active device 203. Therefore, the design of active device 203 can be altered to accommodate other concerns decoupled from concerns regarding the floating-body effect. In addition, in specific embodiments of the invention the impedance of the variable impedance circuit branch in its low impedance state can actually be higher than in some prior art body contacts and still retain efficacy. In embodiments of the present invention utilizing smart body contacts to prevent harmonic distortion of a signal passing above an off state RF switch, the carriers that must be removed from the body are those generated through much slower processes than those generated by avalanche breakdown and impact ionization. The relevant processes are several orders of magnitude slower and therefore the generated charge can be removed even through a high impedance path. Therefore, the circuitry that comprises the variable impedance path lying within the active layer can be kept to a minimal size for a commensurately minimal impact on the overall size and cost of a device using SOI structure 300.

A specific embodiment of the present invention can be described with reference again to FIG. 3. In FIG. 3, body contact 204 is ohmic and there is negligible resistance from body contact 204 to second contact 205. Also, second contact 205 is directly below the diode comprised of cathode 301 and anode 302. Since active device 203 is an NFET the gate will go high during its on state. Therefore, anode 302 will be at a lower potential than cathode 301 and the diode will be reversed biased. This will prevent carriers from departing body 109 which will provide the NFET that is active device 203 to support a higher drive current and prevent forward bias of the body to source diode, which would cause high currents to flow in an undesired path. If active device 203 was a PFET the gate would go low during its on state. Therefore, anode 302 and cathode 301 would need to be switched in FIG. 3. If this configuration were applied, the diode would be reversed biased when the PFET was in its on state and the device 206 could support a higher drive current in its on state, and prevent forward bias of the body to source diode. Preventing forward bias of this diode is important to avoid the flow of high currents in an undesired path.

In specific embodiments of the present invention, the same bias scheme is provided to body 109 as described with reference to FIG. 3 using alternative structures. For example, an independent voltage bias source can be applied to body 109 through electrically conductive layer 201. This voltage bias source would provide a variable voltage depending upon the voltage on gate 113 to provide the same effect as described with reference to FIG. 3. As another example, a FET could be coupled in as part of variable impedance path to serve a similar function to that provided by the diode in FIG. 3, that is, the FET will provide a low impedance path from the body to the gate when the transistor is not in an on state, and will provide a high impedance path from the body to the gate when the transistor is in an on state. In specific embodiments of the invention, various other circuits and configurations are applied for removing the charge from body 109 in accordance with the concepts illustrated by FIG. 3.

Figure 4:
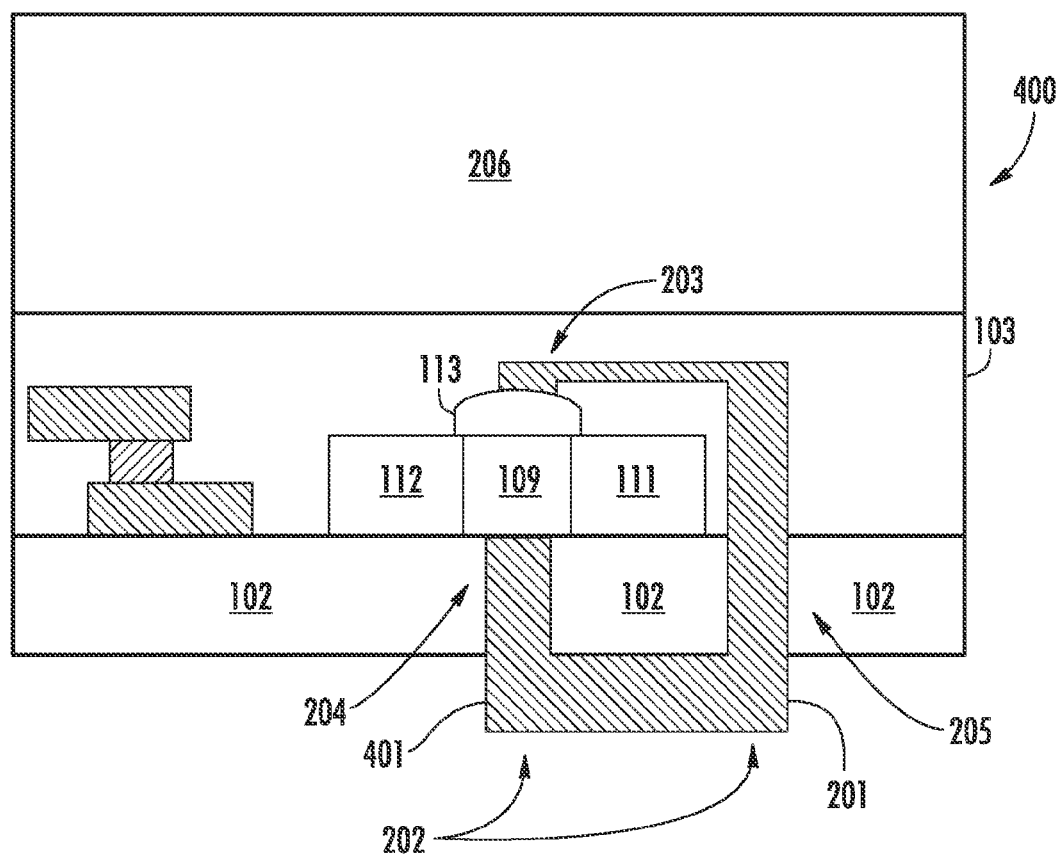
FIG. 4 illustrates a block diagram of an SOI structure with a back side body contact coupled to a gate through a hot-carrier-junction diode that is in accordance with the present invention.

An SOI structure 400 that is in accordance with the present invention can be described with reference to FIG. 4. FIG. 4 is similar to FIG. 2 with the exception that the circuit branch from second contact 205 rising up into active layer 103 is a variable impedance path 401. In specific embodiments of the invention, body contact 204 is a hot-carrier diode which provides for the variable aspect of variable impedance path 401. In specific embodiments where active device 203 is an NFET device, the hot-carrier diode would be reversed-biased when the potential on gate 113 was high, and forward biased if the potential on gate 113 was low. These embodiments will therefore exhibit the same characteristics described above with reference to smart body contacts. Advantageously, this configuration does not require any active devices to be built up in active layer 201. This will therefore save space given that variable impedance path 401 can be implemented using only a single metal line passing through active layer 103.

In specific embodiments of the invention, the metal used to form electrically conductive layer 201 is used for other purposes as well. For example, the metal may be used as assembly metal to provide contacts to the active layer. Such contacts could be used to provide power signals into the active layer. The contacts could also be used to route signal lines to and from the active layer. As another example, the metal can be run along the channel on the backside of the SOI structure to decrease the capacitance between body and source and between body and drain. The reason this configuration will reduce these parasitic capacitances is the metallization will not cross over the source or drain silicon and will instead remain over the channel or body area. Therefore the parallel plate capacitance between the body metal line and the source and/or drain is minimized. This will produce advantageous results given that the speed and performance of a device is inherently limited by the size of its parasitic capacitances.

Figure 5:
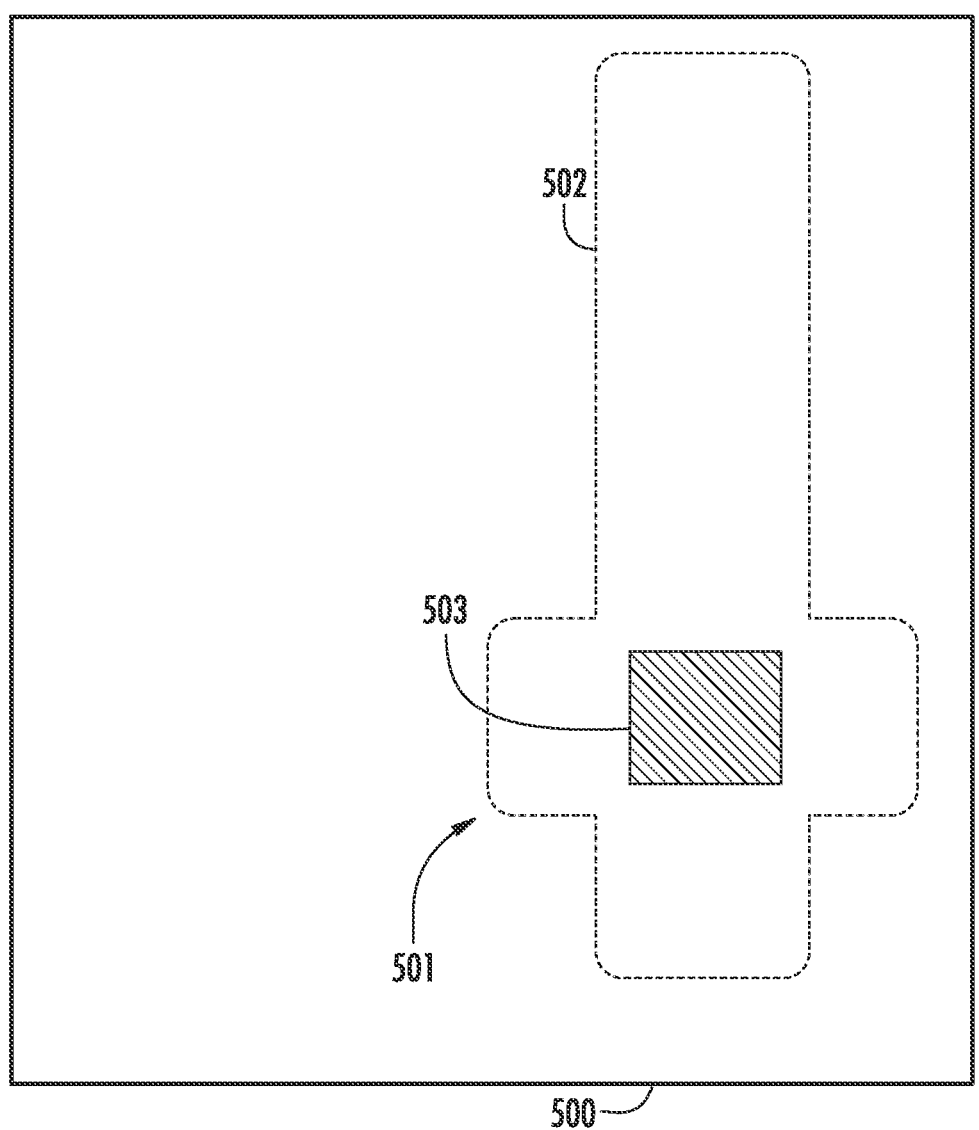
FIG. 5 illustrates a block diagram of the back side of an SOI structure having large polysilicon contact pads that is in accordance with the present invention.

A specific embodiment of the invention exhibiting large channel contacts can be described with reference to FIG. 5. FIG. 5 illustrates the back surface of SOI structure 500. Lithographic resolution and alignment capabilities of a fabrication process may preclude the creation of a contact to be used as body contact 204 with a high rate of success. A critical design failure would result if nearly any FET in a design was faced with a situation where its drain and source where shorted together by the electrically conductive material used for body contact 204. In specific embodiments of the invention, larger landing pads 501 of channel material can be made to increase the width of channel 502 at the channel contact locations by an amount sufficient to allow contact to the channel while ensuring that source or drain are not contacted. As seen in FIG. 5, the metal deposited to form backside contact 503 to form body contact 204 has a larger area to make contact with channel 502 at landing pad 501 thereby reducing constraints upon the manufacturing process and potentially increasing fabrication yield. One method that can be used to create a larger landing pad 501 includes widening the polysilicon gate in that shape. A second method that can be used to create a larger landing pad 501 includes altering the source and drain implant layout in that shape while keeping the polysilicon shape unchanged. Although these embodiments slightly work against the advantages of the present invention in terms of decoupling the body contact architecture from the transistor architecture, the modification would generally only need to be slight and would be minimal compared to prior art approaches that deposited body contacts directly under or adjoining the device itself in the active layer.

Methods of producing an integrated circuit that are in accordance with the present invention can be described with reference to FIG. 6. In step 600 an SOI structure undergoes processing to form an active device in an active layer of the SOI wafer. The circuitry formed during this step and in this layer can include but is not limited to technologies such as CMOS, BiCMOS, SiGe, GaAs, InGaAs, and GaN. The circuitry can comprise: various active devices such as diodes and transistors; various passive devices such as resistors, capacitors, and inductors; and routing circuitry such as metal wires and vias. Various photolithographic and chemical deposition steps can be conducted to formulate this circuitry. Step 600 includes the formation of a gate of the active device. Step 600 may also include the formation of contacts in the active layer that are disposed on the bottom of the active layer vertically adjacent to the insulator layer. These contacts may be made of channel material in the channel region of the active device. In specific embodiments of the invention, contacts may be made of areas of channel material that are wider than the remainder of a channel formed by the material. These larger areas could form landing pads for later connection to contacts deposited from the back of the active wafer as described above. Step 600 could also include the formation of contact separate from the active device, and a circuit branch that connects to a separate contact formed on the bottom of the active layer. This circuit branch could then connect to the source or gate of the active device. This circuit branch could be used to form part of a variable impedance path or general conductive path as described with regard to the devices described above. Finally, step 600 can also include the step of forming a diode in the active layer. This diode could then be used to form part of the variable impedance path described with regard to the devices described above. This diode can be placed directly above a contact but it can be placed anywhere in the active layer. The diode should be formed so as to match the necessary polarity for the devices described above to function properly in accordance with the present invention.

Figure 6:
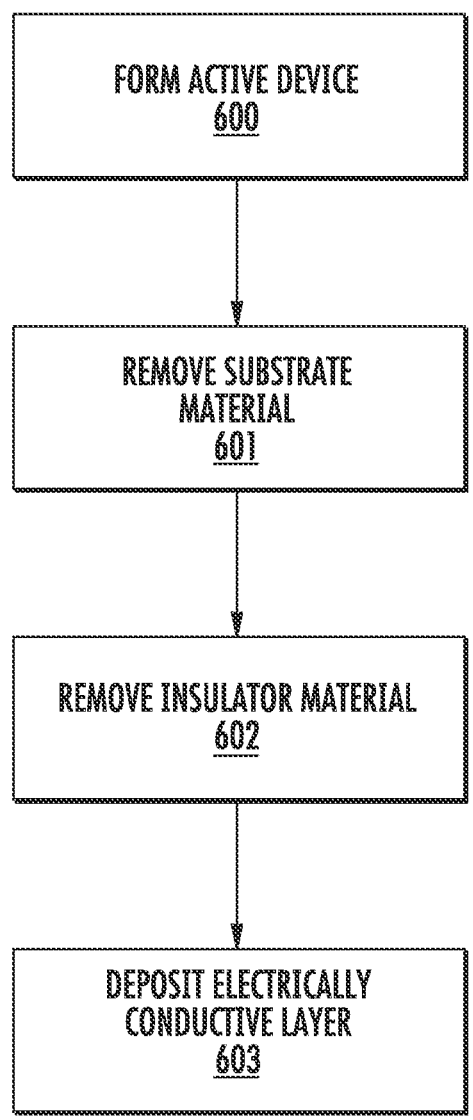
FIG. 6 illustrates a process flow chart of a method of fabricating an integrated circuit having a back side body contact that is in accordance with the present invention.

The remaining steps of the method illustrated by FIG. 6 involve backside processing. These steps may be preceded by the attachment of a temporary handle wafer to the top side of the SOI wafer. This wafer can provide stability to the SOI wafer while the remaining steps are carried out. However, as mentioned previously the attachment of this wafer is not necessary as support can be provided through other means. The handle wafer can have an insulator layer that bonds through various means to the top of the SOI wafer. However, the handle wafer may also have a layer that bonds to the top of the SOI wafer that is comprised of semiconductor material or a conductive material. In step 601, back side processing commences with the removal of the SOI wafer substrate. The substrate could be removed using mechanical and chemical means independently or in combination. For example, mechanical grinding can be used to thin the substrate material from an original thickness of approximately 800 micrometers ($\mu$m) to approximately 20 $\mu$m. If the substrate is silicon, the final thickness of substrate material may be removed with a wet etch such as KOH or TMAH. The final thickness of substrate material may also be removed using a dry plasma etch. The substrate can be removed with a high precision or etch rate ratio. The etch rate ratio refers to the ratio of the portion of desired substrate material that was removed from the back of the wafer to the portion of additional material that was removed which should not have been removed. In specific embodiments of the invention, the insulator layer is a buried-oxide that acts as an etch stop since the etch rate ratio is extremely high for the removal of all the substrate up to the buried oxide.

In specific embodiments of the invention, the removal of substrate material in step 601 is followed by the deposition of dielectrics or passivation layers. In specific embodiments of the invention, step 601 can be followed by the deposition of passivation layers to prevent ionic contamination of the SOI structure. Finally, in specific embodiments of the invention, step 601 can be followed by the deposition of dielectric layers which have the added benefit of reducing coupling capacitance between active devices in the active layer and the back side electrically conductive layer by spacing the electrically conductive layer away from the active devices.

In step 602, insulator material is removed from the back of the SOI wafer to form an excavated insulator region. In specific embodiments of the present invention, this excavated insulator region is located below a body of an active device in the active layer, and a second portion of this excavated insulator region is located below a separate portion of the active layer. In specific embodiments of the present invention, the excavated insulator region may be located underneath the prepared contacts that may have been produced in step 600. In specific embodiments of the invention, the separate portion of the active layer may be where a diode that was produced in step 600 is located. Step 602 may involve the removal of additional layers including passivation dielectric. In general, the pattern of insulator removal will allow for the deposition of an electrically conductive layer in step 603 that will allow electrical contact between any of the individual portions of the excavated insulator region. These patterns can be formed using standard photolithographic techniques and wet or dry etches.

In step 603, an electrically conductive layer is disposed on the back side of the SOI wafer. This layer can be applied in a patterned fashion to allow for connection between isolated sets of portions of the excavated insulator region. This electrically conductive layer will couple the body of an active device in one portion of the excavated insulator region to a separate portion of the excavated insulator region. The deposition of this electrically conductive material can be done using electron beam sputtering, electroplating, electroless plating, selective chemical vapor deposition, and various other methods. In specific embodiments of the invention, step 603 can be accompanied by the deposition of various other layers to provide improved thermal characteristics to the SOI structure. In specific embodiments of the invention, step 603 can be accompanied by the deposition of multiple layers in sequence providing barrier metal layers, anti-reflection coatings, and various other layers.

In specific embodiments of the invention, the electrically conductive material deposited in step 603 is patterned across the back of the SOI structure. The electrically conductive material can be patterned to run parallel or perpendicular with the channel of an active device in the active wafer. However, the electrically conductive material can be patterned independently of the channel orientations as well. In the specific embodiments where the electrically conductive material is patterned to run parallel with the channel, the overall capacitance seen by the active device will be decreased.

In specific embodiments of the invention, the electrically conductive material deposited in step 603 forms a hot-carrier diode junction between the active layer and the electrically conductive material at the body contact. In situations where the active device is a NFET and the body is thereby p-type, various materials can be used to create this device. A nonexclusive list of metals that can be used includes, aluminum, titanium, gold, palladium, nickel, platinum, and cobalt. If the device is a PFET and the body is thereby n-type, the same nonexclusive list includes, aluminum, platinum, chromium, gold, and hafnium. The benefits of the resulting configurations are described above. In order to reduce sheet resistance, a thin layer of the metal used to create the hot-carrier diode can first be deposited, followed by a layer of lower resistivity metal such as aluminum or copper.

In specific embodiments of the invention, the electrically conductive material deposited in step 603 is additionally used for assembly. The electrically conductive layer could comprise solder bumps, copper posts, or other types of packaging materials. This assembly metal could be used to provide power to the circuit in the active layer of the SOI structure, and could additionally route signals to and from the active layer of the SOI structure. This assembly material could also be disposed in a separate deposition after the electrically conductive layer used to generate the body contact has already been deposited.

An SOI structure 700 that is in accordance with the present invention can be described with reference to FIG. 7. SOI structure 700 comprises electrically conductive layer 201. Electrically conductive layer 201 comprises a single contiguous region of material. Electrically conductive layer 201 is at least partially vertically coextensive with insulator layer 102 in excavated insulator region 202. Electrically conductive layer 201 provides a low barrier contact to both body 109 and source 111. Therefore, body 109 is tied to source 111 with a single contact. A structure in accordance with these embodiments can be produced using methods described with reference to FIG. 6 with specific patterns applied for substrate removal in step 601 to expose the bottom of source 111.

Figure 7:
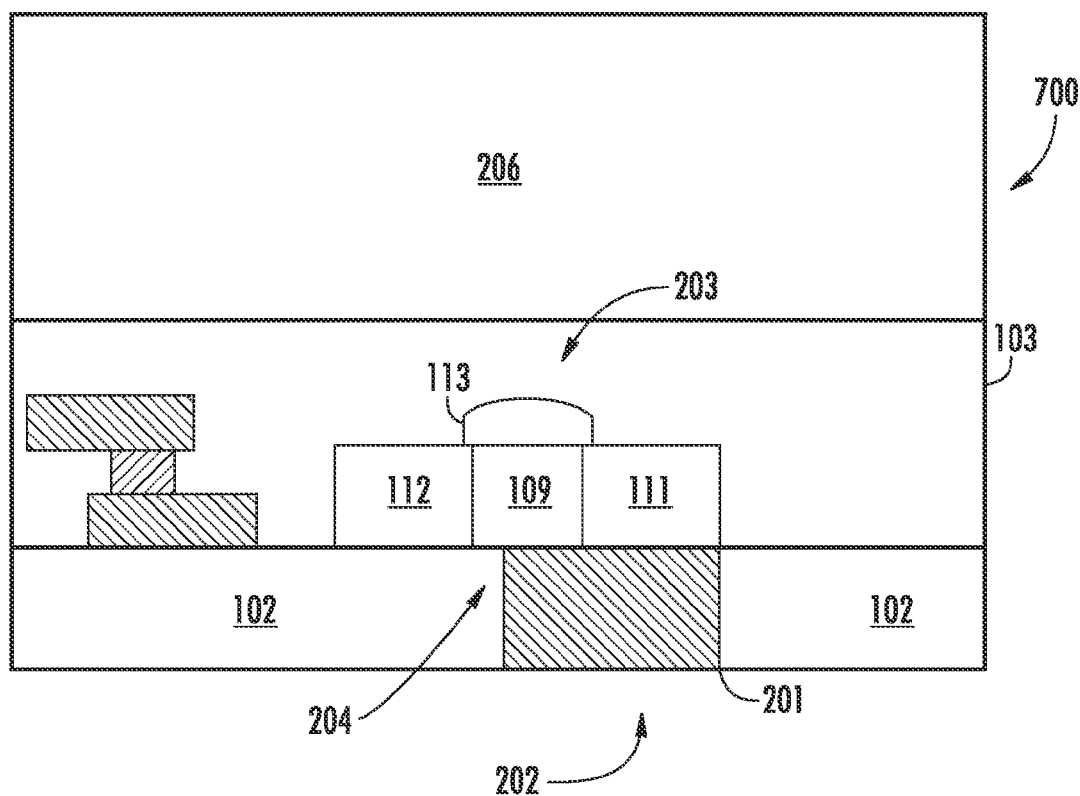
FIG. 7 illustrates a block diagram of an SOI structure that is in accordance with the present invention.

Specific embodiments of the invention that are in accordance with FIG. 7 exhibit advantageous characteristics. With reference to FIG. 5, these embodiments exhibit advantageous characteristics because the back side contact will naturally already have a larger landing pad to work with given that the single contact for electrically conductive layer 201 will be disposed on both body 109 and source 111. In addition, in specific embodiments the tie does not take up any room in active layer 103 because the tie exists solely within excavated insulator region 202. In specific applications, embodiments in accordance with FIG. 7 will be easier to manufacture than other embodiments discussed above.

Although embodiments of the invention have been discussed primarily with respect to specific embodiments thereof, other variations are possible. Various configurations of the described system may be used in place of, or in addition to, the configurations presented herein. For example, although the devices were discussed often with reference to silicon substrates and oxide insulator layers the invention will function with any form of semiconductor-on-insulator wafers, structures, or devices. For example, the invention will function in combination with silicon-on-sapphire structures. In addition, the invention can function or operate upon circuitry using any form of technology such as CMOS, bipolar, BiCMOS, SiGe, Ga, As, InGaAs, GaN and any other form of semiconductor technology or compound semiconductor technology. In addition, there may be additional layers of materials disposed between those layers mentioned herein. Semiconductor processing is a highly detailed field, and layers were only mentioned herein if they were absolutely necessary to describe the invention to avoid confusion. For example, there may be layers of passivation disposed on the active layer to prevent the circuitry from reacting with its environment. In addition, the use of the word "layer" such as when describing an active layer or a insulator layer does not preclude such layers being comprised of more than one material. For example, there may be layers of glass or some other insulator below metal lines in active circuitry in addition to a silicon-dioxide insulator beneath the entire active layer of an SOI structure. However, the term insulator layer can cover the entire structure of the glass and silicon-dioxide insulator.

Those skilled in the art will appreciate that the foregoing description is by way of example only, and is not intended to limit the invention. Nothing in the disclosure should indicate that the invention is limited to systems that require a particular form of semiconductor processing or to integrated circuits. Functions may be performed by hardware or software, as desired. In general, any diagrams presented are only intended to indicate one possible configuration, and many variations are possible. Although the disclosure was focused on the application of the invention to FET devices the invention will also help to alleviate parasitic issues for BJT devices in SOI architectures. Those skilled in the art will also appreciate that methods and systems consistent with the present invention are suitable for use in a wide range of applications encompassing any related to the accumulation of charge carriers in a specific region of an electronic device.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

The invention claimed is:

1. A method of fabricating an integrated circuit, the method comprising the steps of:
    forming an active device in an active layer of a semiconductor-on-insulator wafer;
    removing a substrate material from a substrate layer disposed on a back side of the semiconductor-on-insulator wafer;
    removing an insulator material from a back side of the semiconductor-on-insulator wafer to form an excavated insulator region; and
    depositing an electrically conductive layer on the excavated insulator region;
    wherein the depositing puts the electrically conductive layer in physical contact with a body of the active device in a first portion of the excavated insulator region, and couples the body to a contact, the contact being in a second detached portion of the excavated insulator region and being physically connected to another part of the active device.

2. The method of fabricating an integrated circuit from claim 1, further comprising the step of forming a handle wafer above the active layer.

3. The method of fabricating an integrated circuit from claim 1, further comprising the step of selecting a lower resistivity metal to form at least a portion of the electrically conductive layer.

4. The method of fabricating an integrated circuit from claim 1, further comprising the step of forming a circuit branch from the contact to a source of the active device.

5. The method of fabricating an integrated circuit from claim 1, wherein the depositing forms a segment of a variable impedance circuit branch having a high impedance when the active device is in an on state, and a low impedance when the active device is not in the on state.

6. The method of fabricating an integrated circuit from claim 5, further comprising the step of forming a gate region of the active device and a second segment of a variable impedance circuit branch from the gate to the contact.

7. The method of fabricating an integrated circuit from claim 1, further comprising the step of forming a diode in the active layer directly above the contact, the diode being reversed biased when the active device is in an on state.

8. The method of fabricating an integrated circuit from claim 1, wherein the depositing forms a hot-carrier diode junction between the active layer and the electrically conductive layer.

9. The method of fabricating an integrated circuit from claim 1, further comprising the step of depositing an assembly material, the assembly material being electrically coupled to the electrically conductive layer.

10. The method of fabricating an integrated circuit from claim 9, wherein the assembly material comprises solder bumps or copper posts.

11. A method of fabricating an integrated circuit, the method comprising the steps of:
    forming an active device in an active layer of a semiconductor-on-insulator wafer;

removing a substrate material from a substrate layer disposed on a back side of the semiconductor-on-insulator wafer;

removing an insulator material from a back side of the semiconductor-on-insulator wafer to form an excavated insulator region; and depositing an electrically conductive layer on the excavated insulator region;

and wherein:

the depositing puts the electrically conductive layer in physical contact with a body of the active device in a first portion of the excavated insulator region, and couples the body to a contact, the contact being in a second detached portion of the excavated insulator region; and the forming of the active device in the active layer further comprises forming a landing pad above a point where the body is contacted by the electrically conductive layer, the landing pad being comprised of a wider region of the body.

12. The method of fabricating an integrated circuit from claim 11, further comprising the step of forming a handle wafer above the active layer.

13. The method of fabricating an integrated circuit from claim 11, further comprising the step of selecting a lower resistivity metal to form at least a portion of the electrically conductive layer.

14. The method of fabricating an integrated circuit from claim 11, further comprising the step of forming a circuit branch from the contact to a source of the active device.

15. The method of fabricating an integrated circuit from claim 11, wherein the depositing forms a segment of a variable impedance circuit branch having a high impedance when the active device is in an on state, and a low impedance when the active device is not in the on state.

16. The method of fabricating an integrated circuit from claim 15, further comprising the step of forming a gate region of the active device and a second segment of a variable impedance circuit branch from the gate to the contact.

17. The method of fabricating an integrated circuit from claim 11, further comprising the step of forming a diode in the active layer directly above the contact, the diode being reversed biased when the active device is in an on state.

18. The method of fabricating an integrated circuit from claim 11, wherein the depositing forms a hot-carrier diode junction between the active layer and the electrically conductive layer.

19. The method of fabricating an integrated circuit from claim 11, further comprising the step of depositing an assembly material, the assembly material being electrically coupled to the electrically conductive layer.

20. The method of fabricating an integrated circuit from claim 19, wherein the assembly material comprises solder bumps or copper posts.

* * * * *